United States Patent [19]

Jorgensen

[11] 4,057,797
[45] Nov. 8, 1977

[54] ALL DIGITAL DELTA TO PCM CONVERTER

[75] Inventor: Adam A. Jorgensen, Rochester, N.Y.

[73] Assignee: Stromberg-Carlson Corporation, Rochester, N.Y.

[21] Appl. No.: 637,226

[22] Filed: Dec. 3, 1975

[51] Int. Cl.² .......................................... H03K 13/22
[52] U.S. Cl. ........................... 340/347 DD; 325/38 B; 332/11 D
[58] Field of Search .......... 179/15 AP; 340/347 DD, 340/146.1 AX, 347 CC; 235/154; 325/38 B, 42; 328/63; 332/11 D

[56] References Cited

U.S. PATENT DOCUMENTS

| 3,596,267 | 7/1971 | Goodman | 340/347 DD |
| 3,750,144 | 7/1973 | Bolus et al. | 340/347 DD |
| 3,795,900 | 3/1974 | Monford | 325/38 B X |
| 3,922,619 | 11/1975 | Thompson | 325/38 B X |

OTHER PUBLICATIONS

Jones, "Digital Transversal Filter with Read-Only Memory," IBM Technical Disclosure Bulletin, vol. 15, No. 3, 8/72, pp. 976, 977.

Primary Examiner—Thomas J. Sloyan
Attorney, Agent, or Firm—Hoffman Stone; William F. Porter, Jr.

[57] ABSTRACT

A digital circuit for converting a delta modulated signal to a binary coded signal without producing an interim analog signal. The principal portions of the circuit are an up-down counter, a read-only memory the instantaneous output of which is controlled by the up-down counter, logic for driving the up-down counter in response to an incoming delta modulated signal, and a scanner for producing time-spaced pulses in response to the instantaneous outputs of the memory. A comparator is also included for driving the up-down counter relatively slowly to compensate for drift by ensuring that, over relatively long periods such as a few seconds, the output of the up-down counter oscillates around its mid-value.

6 Claims, 4 Drawing Figures

ALL DIGITAL DELTA TO PCM CONVERTER

BRIEF DESCRIPTION:

This invention relates to a novel circuit for converting a delta modulated signal to binary coded form without producing an interim analog signal.

Delta modulation is known and is described in U.S. Pat. Nos. 3,249,870, 3,518,548, and 3,831,092, which also describe certain companding schemes for reducing the so-called quantizing and low level noise, and for improving the accuracy of signal reproduction at the receiver. Reference may be had to those patents for an overall understanding of delta modulation and the companding schemes in general.

It is sufficient for the purposes of this application simply to note that delta modulation is a pulse code modulation signalling system in which pulses are transmitted only as required to reinforce an otherwise decaying reference voltage at the receiver to cause it to conform in step-wise fashion to the signal it is desired to transmit. For example, so long as the desired signal decays at a rate equal to or greater than the decay of the reference voltage no signal pulses are transmitted, but when the desired signal decays at a lesser rate, or increases in value, pulses are transmitted to cause a lessening or reversal of the decay of the reference voltage.

Instances arise wherein it is desired to convert a delta modulated signal to binary coded form so that, for example, data received at a station in delta modulated form may be sent on from the station over a conventional T-carrier line and received by PCM type carrier equipment. Heretofore, this conversion has been done by first demodulating the delta modulated signal to reproduce the analog signal from which it was derived, and then applying the analog signal to produce the desired binary coded output signal. That procedure is disadvantageous in that it tends to degrade the analog signal and to require the use of unnecessarily extensive and complex circuitry.

The present invention contemplates the direct conversion of a delta modulated signal to a binary coded signal carrying substantially the same data without going through the steps of producing an intermediate analog signal, and with relatively simple, straightforward, and inexpensive circuitry.

In the embodiment described herein, the incoming delta modulated signal is applied through a relatively simple arrangement of logic gates to drive an up-down counter, the outputs of which are applied to select the outputs of a read-only memory matrix. A scanner periodically scans the output of the memory matrix to produce time divided binary coded signals in accordance with the instantaneous selections of the up-down counter.

Compensating circuits are included at the inputs of the up-down counter to expand the count complementarily to the compression applied at the transmitter to complete the companding process such as one of those described, for example, in the hereinabove identified patents.

The circuit of the invention may readily be arranged for multiplex operation, preferably by including a separate up-down counter for each channel, and time-sharing the input logic, the read-only memory, and the output scanner.

DETAILED DESCRIPTION:

A presently preferred embodiment of the invention will now be described in detail in conjunction with the drawings, wherein.

Figure 1:
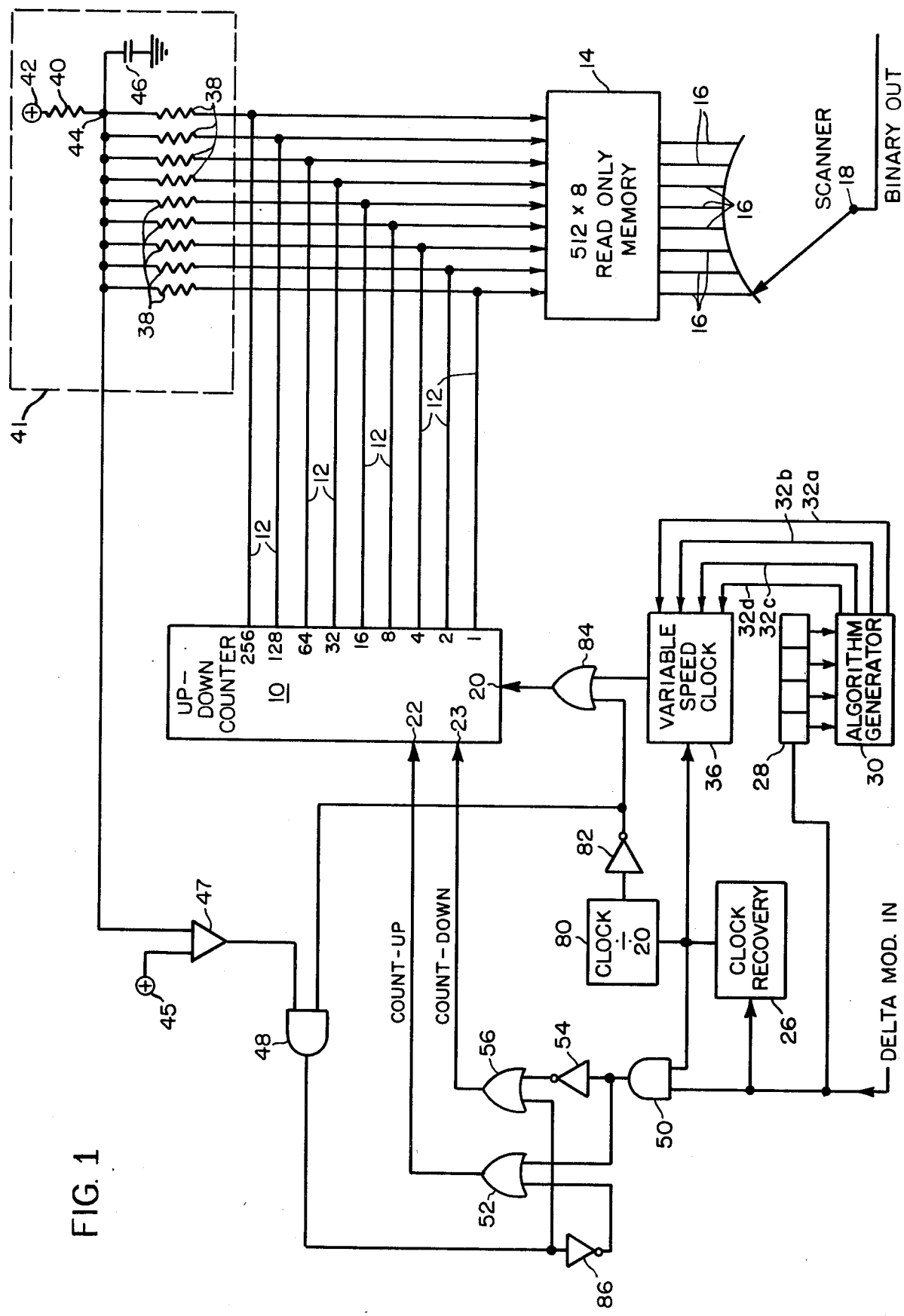
FIG. 1 is a schematic diagram of a circuit according to the invention.

Referring to FIG. 1, the basic unit of the circuit is the binary up-down counter 10, which includes enough output terminals to provide a separate representative binary number output for each quantized signal level distinguishable in the delta modulated input signal, typically nine terminals to distinguish among 512 different levels. The outputs of the counter 10 are applied to a read-only memory 14 to control the instantaneous output of the memory in accordance with the instantaneous conditions at the various output terminals 12 of the counter. The output terminals 16 of the memory are periodically scanned by a scanner 18 to produce time divided binary coded output signals.

The circuit of the invention includes means for expanding the delta signal as required in a delta modulation receiver of the kind described in the hereinabove identified patents. The counter 10 is not indexed directly in response to the incoming delta modulated signal, but instead is indexed at rates selected in accordance with the required expansion so that the output of the counter 10 tends to represent the actual successive quantization levels of the analog signal from which the delta signal was derived.

First, it should be understood that the counter 10 indexes only upon the occurrence of a predetermined change in the condition at its clock input 20, and the step is either UP or DOWN in accordance with the conditions at the count input terminals 22 and 23 at the instant the change occurs at the clock terminal 20.

The incoming delta modulated signal is applied first to a so-called clock recovery circuit 26, which, in response to the incoming signal, generates a clock signal of exactly the same frequency as the frequency of the master clock at the transmitter, which times the signal in the first place. The design of the clock recovery circuit 26 is not important so far as the invention is concerned. Any desired circuit may be used provided only that it is capable of producing the required output. Several different arrangements are known.

The incoming delta modulated signal is also applied to a shift register 28, which controls what may be called an algorithm generator 30. The generator 30 is arranged to produce step control expansion signals at its output terminals 32a, 32b, 32c, and 32d complementary to the step control signal compression applied at the transmitter, thereby to expand the signal to correspond to its original form. The algorithim generator 30 will ordinarily be a simple matrix of gates (not shown in detail) which are selectively enabled and inhibited in accordance with the instantaneous conditions of the respective stages of the shift register. The number of stages in the shift register 28, and the number of different outputs available from the generator 30 are selected in view of the companding algorithim used in the delta modulation system. The generator 30 shown includes four different outputs, one from each of its output terminals 32a–32d, but in practice any desired number may be used. Some companding algorithm that have been proposed may be satisfied with three, some require five or six.

The counter 10 indexes in accordance with the instantaneous conditions of the outputs of the generator 30. The companding scheme will sometimes require that the counter 10 index not at all or only a single count during a particular time slot in the delta modulated signal, and sometimes that it index several counts, depending upon the sequence of the delta pulses. For this reason the clock signal applied at the clock input 20 of the counter is not simply the output of the clock recovery circuit 26, but instead is the output of a step variable clock 36 that is capable of running several times faster than the master clock of the delta modulated system.

For example, in the embodiment shown, the maximum expansion factor may be taken as six, meaning that at the most it will be desired to index the counter 10 six counts during any one time slot of the input signal. In this case, the maximum speed of the variable clock must be at least six times the rate of the master clock. Since binary circuit components are readily available, and eight is a more convenient number than six to deal with in binary digital circuits, the variable clock is preferably one capable of running eight times as fast as the master clock.

The general scheme of operation should now be clear. If it be assumed that the counter 10 starts at its mid-value output of 256 (decimal equivalent) its output will follow the original analog signal encoded in the delta pulse train so long as the outputs of the algorithim generator 30 are exactly complementary to the compression applied at the transmitter. The counter 10 operates, in effect, as a demodulator, converting the incoming delta stream to a succession of space divided signals representing binary numbers indicating the quantized values of the successive samples of the original analog signal.

For some purposes, the outputs 12 of the counter may be periodically scanned to produce time divided, binary coded signals. However, companding is required in most binary coded signalling systems, and if often happens that the number of quantization levels distinguishable in the binary coded system differs from the number distinguishable in the delta modulation system. For these reasons, to provide for compression of the binary coded output signal, and to accommodate any difference between the numbers of quantization levels in the input signal and in the output signal, the output of the counter 10 is applied to control the read-only memory 14, and the time divided binary coded output is generated by periodically scanning the output of the memory.

The memory 14 is set up to produce a predetermined output signal in response to each different count value at its input to give an optimum correlation between the delta input signal and the binary coded output.

There remains the so-called drift problem. The actual count in the counter 10 tends, in practice, to drift from the theoretical value because of various factors such as electrical noise, ambiguities in the quantization of the original analog signal, and possible differences between the actual expansion signals produced by the algorithim generator 30 and the theoretically desired expansion signals. It is desirable, therefore, to insure that, on a long term basis, the counter 10 oscillates around its mid-value, in the illustrated case 256. In the circuit as shown this is accomplished by inserting false counts into the counter 10 at a slow rate in directions tending to return it to its mid-value output.

For this purpose the output of the counter 10 is converted to a slowly varying analog signal in a digital-to-analog convertor network 41. The analog signal is compared to a reference voltage, and the counter 10 is indexed periodically in a direction to drive the analog signal toward the reference voltage. Each of the output terminals of the counter 10 is connected through a separate resistor 38 of approximately weighted value to one terminal of a ballast resistor 40, the other terminal of which is connected to a source of reference voltage 42. The resistors 38, taken with the ballast resistor 40 constitute a voltage divider with the division point at their common junction 44. The divided voltage at the common junction 44 is integrated by a capacitor 46 of relatively large value so that the divided voltage varies only slowly, with a time constant, say, of a few seconds.

The slowly varying divided voltage at the junction 44 is compared with a constant reference voltage from a source 45 in a comparator 47, which produces an output voltage of one polarity if the divided voltage is less than the reference voltage and of the opposite polarity if the divided voltage is greater. The constant voltage from the source 45 is selected to be equal to the voltage across the capacitor 46 when the output of the counter 10 is maintained steadily at its mid-value. The output of the comparator 47 is applied to one input of an AND gate 48, through which it is applied periodically to index the counter 10. Control of this function will be described in detail hereinafter following a description of the logic at the inputs of the counter 10.

Returning now to the portion of the circuit at the inputs of the up-down counter 10, the output of the clock recovery circuit 26 consists of a series of pulses all of the same polarity occurring at the maximum repetition rate possible in the incoming delta modulated signal. Certain ones of the pulses at the output of the clock recovery circuit 26 may be said to represent "ones" in the delta bit stream, and the others to represent "zeroes". The pulses representing "ones" are applied to the COUNT UP terminal 22 of the counter, and those representing "zeroes" to the COUNT DOWN terminal 23. This is done by applying the output of the clock recovery circuit to one input of an AND gate 50 and the incoming delta bit stream to the other input of the gate 50. The output of the gate 50 is applied directly through an OR gate 52 to the COUNT UP terminal 22, and through an invertor 54 and a second OR gate 56 to the COUNT DOWN terminal.

When a delta modulated "one" pulse occurs simultaneously with a pulse from the clock recovery circuit, the AND gate 50 is fully enabled, and the COUNT UP terminal 22 is driven to its so-called high condition, while the COUNT DOWN terminal 23 is driven low. When a "zero" occurs in the delta modulated signal the AND gate 50 is inhibited, and the conditions of the terminals 22 and 23 are reversed, the COUNT DOWN terminal 23 being high and the COUNT UP terminal 22 low.

The step variable clock 36 operates to index the counter 10 either up or down depending on the conditions of the COUNT UP and COUNT DOWN terminals 22 and 23 while the clock 36 is pulsing.

Figure 2:
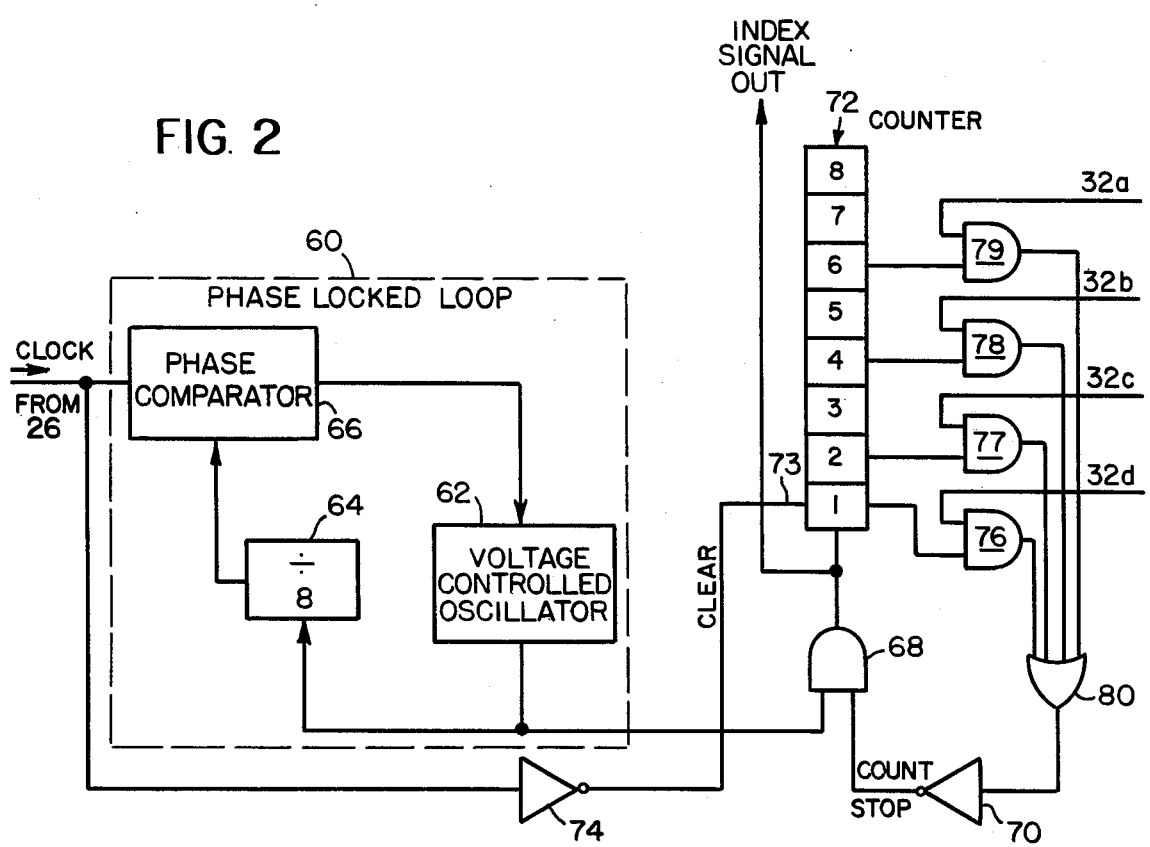
FIG. 2 is a schematic diagram of a variable speed clock suitable for use in the circuit shown in FIG. 1.

One satisfactory arrangement for the clock is shown in FIG. 2, and includes a phase locked loop oscillator 60 consisting of a voltage responsive oscillator 62, a divide-by-eight counter 64, and a phase comparator 66.

The output of the voltage responsive oscillator 62 drives the divide-by-eight counter 64, and the phase comparator 66 compares the phase of the output of the divide-by-eight counter 64 with the output of the clock recovery circuit to produce a control voltage for application to the oscillator 62 to keep its output at exactly eight times the frequency of the clock recovery circuit and in fixed phase relationship to it.

The output of the voltage responsive oscillator 62 is also applied to one input of an AND gate 68, which is normally held inhibited by the output of a COUNT STOP invertor 70. Indexing of the counter 10 is desired whenever one of the output leads of the algorithm generator 30 is high. When all of the outputs of the algorithm generator are low, no indexing is desired, and in this case the gate 68 remains inhibited so long as that condition persists.

The output of the variable clock 36 appears at the output of the AND gate 68 whenever the gate 68 is enabled, and the gate is controlled by an eight step counter 72, which is driven by the output of the AND gate 68. The eight step counter 72 is cleared by the leading edge of each pulse from the clock recovery circuit, which is applied to the COUNTER CLEAR terminal 73 through an invertor 74. Selected stages of the counter 72 are tapped and fed through respectively AND gates 76, 77, 78, and 79, respectively, a common OR gate 80, and the invertor 70 to one input terminal of the AND gate 68 for inhibiting the gate when the selected number of pulses have been fed out through it from the voltage responsive oscillator 62.

In the example shown, the outputs of the algorithim generator 30 are applied to the AND gates 76, 77, 78, and 79, respectively, and the other inputs of the gates are fed from the first, second, fourth, and sixth counts of the counter, respectively. Thus, depending on which one of the gates 76–79 is enabled during a particular time slot, the output of the AND gate 68 will include one, two, four, or six pulses from the voltage responsive oscillator 62, after which the output of the selected count of the counter 72 will apply an inhibit signal to the AND gate 68 and hold the gate 68 inhibited until the start of the next pulse from the clock recovery circuit.

Figure 3:
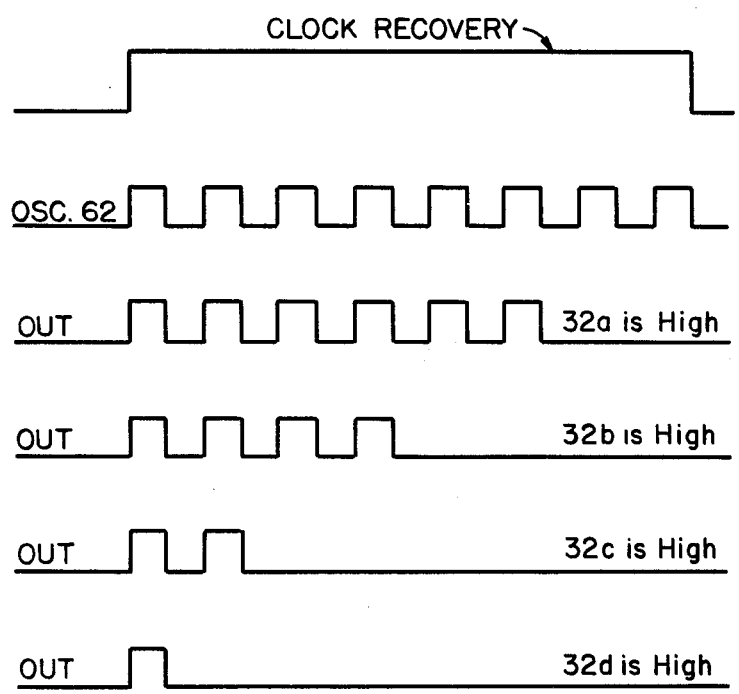
FIG. 3 is a chart of typical signals appearing in the clock of FIG. 2 during operation.

The chart of FIG. 3 shows the illustrative different outputs of the variable speed clock 36 as they appear at the output of the AND gate 68 in accordance with the relatively simple algorithm chosen for the example here.

The selection of the various different numbers of counts to be taken from the voltage responsive oscillator 62 during successive time slots depends on the companding algorithm used in the delta modulation system and must be arranged accordingly. The numbers given herein are illustrative only and are not to be regarded as limiting.

Indexing in response to the drift correction signal at the output of the comparator 47 is done during intervals between successive output pulses of the clock recovery circuit 26. For this purpose, the output of the clock recovery circuit 26 is fed to a divide-by-twenty counter 80, the output of which is fed through an invertor 82 to the OR gate 84 at the clock input 20 of the counter, and, also through the invertor 82, to the second input of the AND gate 48 at the output of the comparator.

The output of the AND gate 48 is applied through an invertor 86 and the OR gate 52 to the COUNT UP terminal 22 of the counter, and directly through the OR gate 56 to the COUNT DOWN terminal 23.

Thus, after every twenty clock pulses, the counter 10 is indexed one count towards its mid-value on a long term basis as measured by the integration network 41.

Figure 4:
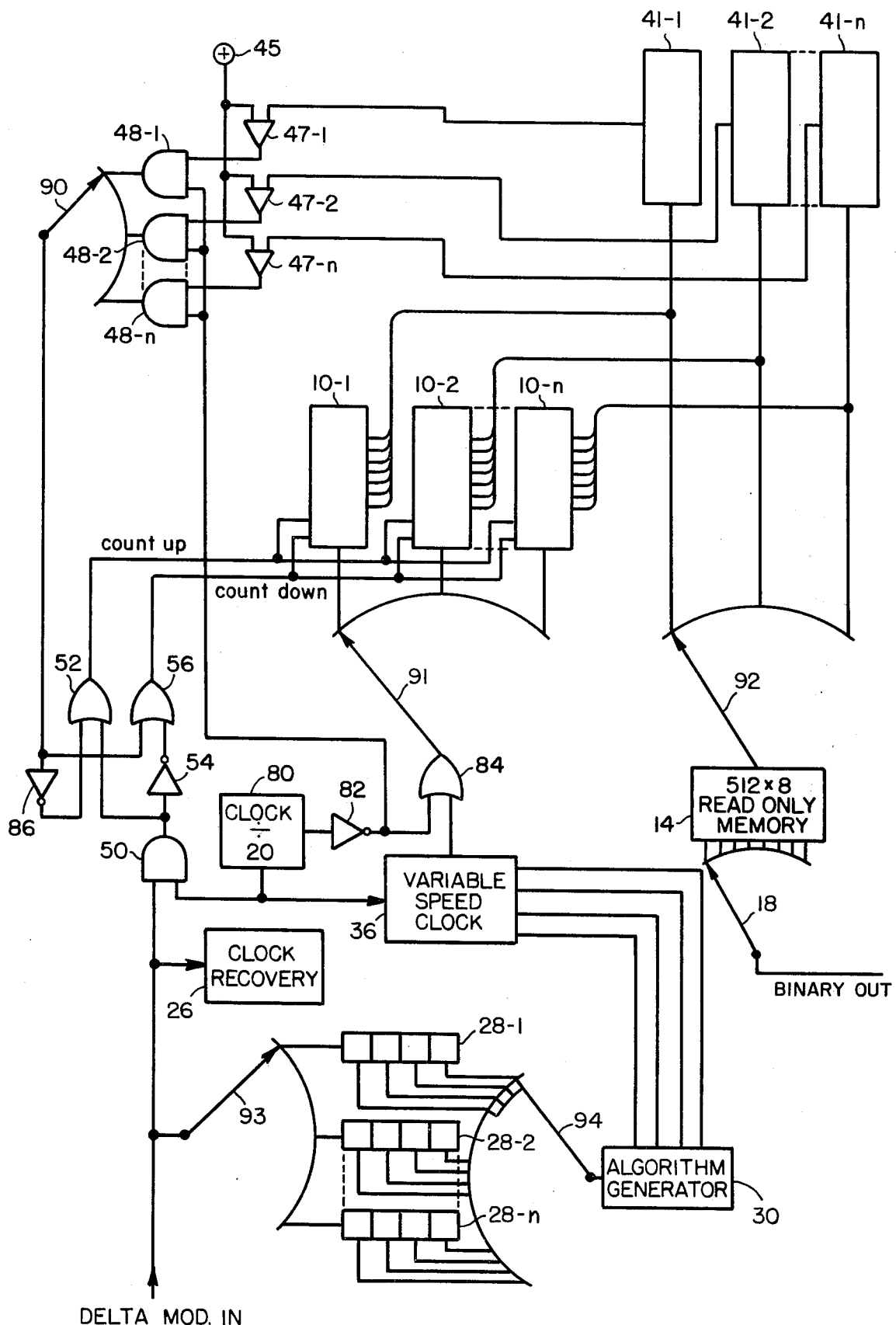
FIG. 4 is a schematic diagram of a circuit according to the invention arranged for multiplex operation.

As shown in FIG. 4, the circuit may readily be arranged for multiplex operation. A separate up-down counter 10-1, 10-2, . . . 10-n is provided for each signalling channel, each counter with its own drift correction network 41-1, 41-2, . . . 41-n. A separate shift register 28-1, 28-2, . . . 28-n is also provided for each channel. All of the other components may be shared by all the channels. Scanners 90, 91, 92, 93, and 94 are connected for switching the individual channel components in predetermined sequence among the shared components.

What is claimed is:

1. A digital signalling circuit for converting a delta modulated signal to a binary coded signal without producing an intermediate analog signal comprising:
   a. an up-down counter having a count capacity sufficient to define uniquely a predetermined number of different quantization levels,
   b. means responsive to an applied delta modulated signal for producing a clock signal having a rate equal to the maximum permitted repetition rate of pulses in the applied signal,
   c. means for indexing said up-down counter responsively to both an applied delta modulated signal and the clock signal produced by said means for producing a clock signal,
   d. drift correction means for biasing said counter toward its mid-value output at a rate much slower than the rate of the means for producing a clock signal, said drift correction means including means for comparing a signal proportional to the output of the counter averaged over a period very much longer than the period of the clock signal with a steady signal indicative of the mid-value output of the counter, and means for periodically indexing the counter toward its mid-value output in response to the output of said means for comparing at intervals much longer than the period of the clock signal, and
   e. means for producing time divided binary coded signals in response to the successive output counts of said counter.

2. A digital signalling circuit according to claim 1 wherein the capacity of said counter is sufficient to define a separate number for each different quantization level distinguishable in the incoming delta modulated signal.

3. A digital signalling system according to claim 1 in which the capacity of said counter is sufficient to define a separate number for each different quantization level distinguishable in the binary coded output signal it is desired to produce.

4. A digital signalling system according to claim 1 wherein said means for indexing includes signal expansion means for selecting the number of steps the counter is indexed during each cycle of the clock signal produced by said means for producing a clock signal in accordance with the companding algorithm incorporated in the incoming delta modulated signal, whereby the output of the counter tends to represent in space divided binary form the numerical values of the quantization levels of the successive samples of the analog signal from which the delta modulated signal was derived.

5. A digital signalling system according to claim 1 wherein said means for producing binary coded signals includes a scanner for periodically scanning the outputs of the counter and producing responsively thereto time divided binary coded signals.

6. A digital signalling system according claim 1 wherein said means for producing binary coded signals includes a read-only memory for converting the output signals of said counter according to a predetermined scheme to space divided binary coded signals that differ at least in some instances from the output signals of said counter, and a scanner is connected for periodically scanning the output of said memory to produce time divided binary coded signals.

* * * * *